United States Patent [19]

Holland

[11] Patent Number: 4,613,767
[45] Date of Patent: Sep. 23, 1986

[54] LOW FORWARD-VOLTAGE DROP SCR

[75] Inventor: Varnum S. Holland, Amherst, N.H.

[73] Assignee: Unitrode Corporation, Lexington, Mass.

[21] Appl. No.: 546,983

[22] Filed: Oct. 31, 1983

[51] Int. Cl.[4] .......................... H03K 17/72; H03K 3/26
[52] U.S. Cl. ................................ 307/288; 307/252 A; 307/305; 307/274; 357/38
[58] Field of Search .......... 307/252 A, 252 C, 252 G, 307/252 F, 252 M, 274, 284, 288, 305; 357/38

[56] References Cited

U.S. PATENT DOCUMENTS

| | | | |
|---|---|---|---|
| 3,619,652 | 11/1971 | Ogle | 307/284 |
| 4,081,698 | 3/1978 | Minakuchi | 307/288 |
| 4,472,642 | 9/1984 | Akamatsu | 307/252 C |

Primary Examiner—John Zazworsky
Attorney, Agent, or Firm—Weingarten, Schurgin, Gagnebin & Hayes

[57] ABSTRACT

An SCR having a reduced forward-voltage drop comprising an independently powered latch circuit driving an output transistor in combination with an additional turn-off transistor. The SCR provides saturated operation of the output transistor and self-commutation which allows for the SCR to turn-off. The present invention is particularly suitable for use in integrated circuit structures having additional circuit functions thereon.

7 Claims, 3 Drawing Figures

LOW FORWARD-VOLTAGE DROP SCR

FIELD OF THE INVENTION

The present invention relates to SCR devices, and in particular to integrated circuits including a self-commutating low forward-voltage drop SCR.

BACKGROUND OF THE INVENTION

The usefulness of silicon controlled rectifier (SCR) devices is frequently related to the forward-voltage drop which occurs when the SCR is turned on. Typically, the SCR includes a four-layer structure wherein the forward-voltage drop is usually at least the sum of $V_{be}$ and $V_{sat}$ voltages of the transistor elements comprising the SCR device. It is therefore advantageous to reduce the forward-voltage drop of the SCR to enhance its performance. For instance, the reduction of forward-voltage drop will reduce the power dissipation of the SCR device when turned on, or reduce the voltage to which an associated capacitor may be discharged. Moreover, the SCR is required to be self-commutating, that is, to have the ability to turn off when the current flow ceases, and any reduction in forward-voltage drop may not inhibit SCR self-commutation.

SUMMARY OF THE INVENTION

The SCR according to the present invention has a reduced forward voltage drop by eliminating the SCR $V_{be}$ component. The SCR structure includes a separately powered latch circuit which controls an output transistor. The output transistor is saturated when the SCR latch is on, ensuring a minimum forward-voltage drop. An additional turn-off transistor is included to provide self-commutation. The turn-off transistor conducts only after the output transistor saturates, and which generates a turn-off signal to the latch circuit, which then turns the entire SCR device off. Furthermore, the SCR latch circuit, or the output transistor and turn-off transistor combination, can be implemented either separately or together with other circuit portions in an integrated circuit.

BRIEF DESCRIPTION OF THE DRAWING

These and other features of the present invention will be further understood by reading the following, solely exemplary, detailed description of the invention, together with the drawing, wherein.

DETAILED DESCRIPTION OF THE INVENTION

Figure 1:
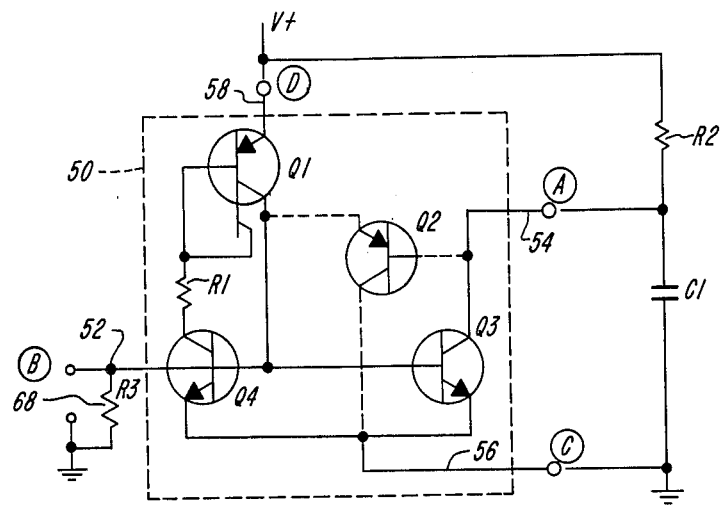
FIG. 1 is a schematic circuit diagram of the SCR in accordance with the invention, illustrated in association with typical external components.
Figure 1A:
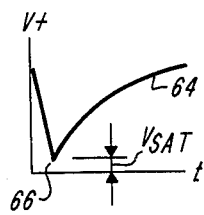
FIG. 1A is a plot of the voltage across the SCR of FIG. 1.

The schematic circuit diagram 50 of the SCR is shown in FIG. 1. Also included in FIG. 1 are external components connected to form a typical circuit. A signal across the SCR is represented by a plot 64 in FIG. 1A demonstrating the operation of the SCR according to the present invention. The SCR includes a gate lead 52, an anode lead 54, and a cathode lead 56. In addition, a fourth lead 58 is included to separately power the SCR latch circuit.

The schematic circuit diagram 50 of the SCR includes an SCR latch circuit including transistor $Q_1$ and $Q_4$ connected to form a positive feedback structure. When one of the transistors $Q_1$ or $Q_4$ becomes conductive from a signal at the base of $Q_4$, the other transistor also becomes conductive, maintaining the state. The current flowing through the latch is limited only by resistor $R_1$, and is selected to provide only the current necessary to saturate the connected output transistor $Q_3$. The gain of the loop including transistors $Q_1$ and $Q_4$ is reduced to less than 1 when additional current is drawn from the collector of transistor $Q_1$ by transistor $Q_2$, discussed below.

The SCR is on when the output transistor $Q_3$ is driven into saturation by a current flow into the base region from the SCR latch circuit, provided by the current from $Q_1$. When the SCR is on, $Q_3$ provides the conduction path to the external elements having a forward voltage drop for the SCR including only the $Q_3$ saturation voltage. Simultaneously, upon saturation of $Q_3$, excess minority carriers are received by an additional turn-off transistor $Q_2$, formed as a parasitic PNP transistor within a substrate of $Q_3$, as discussed below. When the minority carriers are received by $Q_2$, a current flow is drawn from the collector of transistor $Q_1$ of the latch circuit, causing the loop gain to drop below unity, enabling the latch circuit to turn off if there is no signal at the base of $Q_4$. The latch circuit, when in the off state, ceases to provide a current flow in the base region of transistor $Q_3$, allowing the SCR to self-commutate and turn off.

According to the schematic circuit of FIG. 1, the collector, the emitter, and the base of $Q_3$ corresponds to the SCR anode, cathode, and trigger, respectively. A representative external circuit includes a load resistor $R_2$ connecting the anode to the V+ supply, and a capacitor $C_1$ connecting the anode to the cathode, which is in turn connected to the power supply ground return. The quiescent or "off" state of the SCR allows the capacitor $C_1$ to charge to the V+ supply voltage. The gate lead 52 receives a pulse signal, causing the SCR 50 to turn on, discharging the capacitor $C_1$ at a high current rate. A plot 64 of the discharge of the capacitor $C_1$ shows the minimal forward-voltage drop is shown at point 66, comprising only the $V_{sat}$ or saturation voltage of the output transistor $Q_3$, discussed below. The self-commutating characteristic of the present invention permits the SCR to turn off at point 66 by substantially discharging the capacitor $C_1$, wherein all remaining current flows through the gate resistor $R_3$ to ground.

Figure 2:
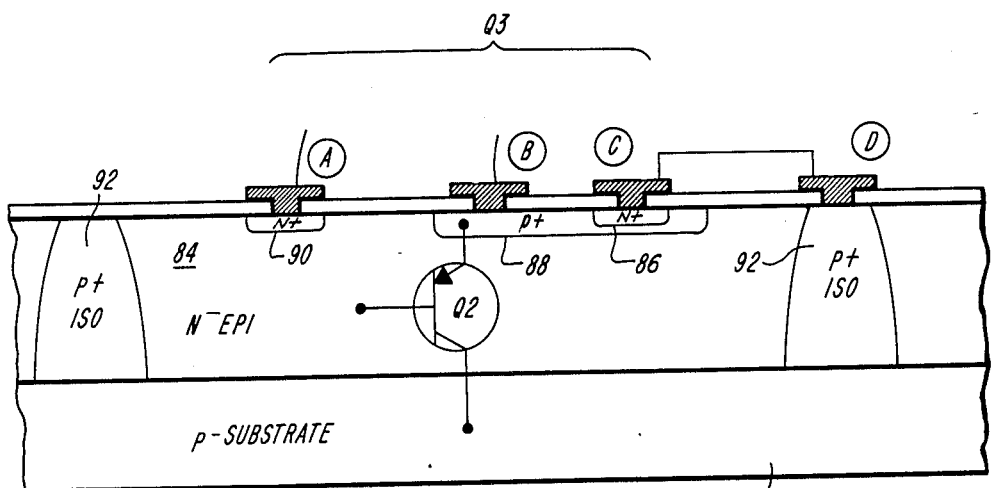
FIG. 2 is an exaggerated cross-sectional view of an integrated circuit embodiment of transistors $Q_2$ and $Q_3$ of FIG. 1.

An exaggerated cross-section 80 of an integrated circuit implementation of transistors $Q_2$ and $Q_3$ is shown in FIG. 2. The transistors $Q_1$ and $Q_4$ typically exist on the same integrated circuit along with other functional elements, adjacent to and out of view of the structure shown in FIG. 2. However, the latch circuit may be implemented with other elements, such as discrete transistors. The structure 80 includes a substrate 82 comprising a P material and an epitaxial N− layer 84 disposed thereon. Transistor $Q_3$ is shown in FIG. 2 and includes the emitter region 86, base region 88, and collector region 90, comprising N+, P+, and N+ type material deposition according to techniques known in the art. A P+ isolation region 92 is diffused through the N− epitaxial layer. The flow of minority carriers provided by the emitter region 86 to the collector 90 is controlled by the base region 88. When the transistor $Q_3$ is initially turned on, all minority carriers are received by the collector 90. However, upon saturation, carriers begin to flow through the $N^-$ epitaxial layer to an isolation region 92, forming the collector of transistor $Q_2$. A schematic representation of transistor $Q_2$ is shown in FIG. 2. Thus according to the present invention, when transistor $Q_3$ is saturated, minority carriers emerge from the base region 88, thereby creating the functional equivalent of an emitter region of transistor $Q_2$ shown in FIG. 1, drawing current from $Q_1$ and turning off the SCR latch circuit. The base junction of transistor $Q_2$ corresponds to the collector region 90 of the structure 80 shown in FIG. 2. The supply of current produced from the receipt of minority carriers in the isolation region 92 is returned to the cathode circuit element connection by a connection external to the semiconductor element.

Other implementations, modifications, or substitutions by one skilled in the art are considered to be within the scope of the present invention, which is not to be limited except by the claims which follow.

What is claimed is:

1. A low forward voltage drop SCR, comprising:
   a latch having an on and an off state providing a latch output signal when in the on state;
   an output transistor operable in response to said latch output signal and including a saturated condition; and
   means to turn off said latch when said output transistor is saturated, wherein
   said output transistor is one of an NPN and a PNP transistor, and
   said means to turn off said latch comprises a second transistor complementary to said output transistor, wherein
   said second transistor provides a current flow to turn off said latch when said output transistor is saturated.

2. The SCR of claim 1, wherein
   said latch includes a plurality of transistors connected to provide positive feedback therein, having a loop gain in excess of unity; and
   said second transistor current is operable to reduce said loop gain to less than unity, causing said latch to turn off.

3. The SCR of claim 1, including
   a first material comprising an emitter region of said output transistor emitter;
   a second material comprising a base region of said output transistor and an emitter region of said second transistor;
   a third material comprising a collector region of said output transistor and a base region of said second transistor; and
   a fourth material comprising a collector region of said second transistor, being electrically connected to said first material.

4. The SCR of claim 3, wherein
   said second transistor is a parasitic transistor formed to include the structure of said output transistor, wherein said fourth material is an isolation barrier for said output transistor.

5. The SCR of claim 2, wherein
   said second transistor and said output transistor are included in a portion of an integrated circuit, and said plurality of latch transistors are external to said portion.

6. The SCR of claim 5, wherein
   said plurality of latch transistors are discrete transistors.

7. A method of providing a low forward-voltage drop SCR comprising the steps of:
   latching a circuit into an on state;
   providing a latch signal when said circuit is on;
   saturating an output transistor according to said latch signal;
   receiving excess carriers produced by said output transistor when saturated;
   providing a current flow in reponse to said excess carriers; and
   unlatching said circuit according to said current flow.

* * * * *